United States Patent
Werner et al.

(10) Patent No.: US 7,660,117 B2
(45) Date of Patent: Feb. 9, 2010

(54) DEFORMABLE DUCT GUIDES THAT ACCOMMODATE ELECTRONIC CONNECTION LINES

(75) Inventors: Douglas E. Werner, Santa Clara, CA (US); James Hom, Redwood City, CA (US); Hae-won Choi, Albany, CA (US); Tien Chih (Eric) Lin, Fremont, CA (US); Richard Grant Brewer, Foster City, CA (US)

(73) Assignee: Cooligy Inc., Mountain View, CA (US)

( * ) Notice: Subject to any disclaimer, the term of this patent is extended or adjusted under 35 U.S.C. 154(b) by 0 days.

(21) Appl. No.: 12/221,945

(22) Filed: Aug. 7, 2008

(65) Prior Publication Data

US 2009/0046429 A1 Feb. 19, 2009

Related U.S. Application Data

(60) Provisional application No. 60/964,025, filed on Aug. 7, 2007.

(51) Int. Cl.
*H05K 7/20* (2006.01)

(52) U.S. Cl. .................. 361/696; 361/687; 361/690; 361/695; 361/699; 361/716; 174/15.1; 174/16.1; 165/80.4; 165/104.33; 454/184

(58) Field of Classification Search .......... 361/687, 361/690, 695, 699, 716; 165/80.4, 104.33; 454/184

See application file for complete search history.

(56) References Cited

U.S. PATENT DOCUMENTS

| | | | |
|---|---|---|---|
| 3,361,195 A | 1/1968 | Meyerhoff et al. | |
| 4,392,362 A | 7/1983 | Little | |
| 4,612,979 A * | 9/1986 | Heitzig | 165/129 |
| 4,894,709 A | 1/1990 | Phillips et al. | 357/82 |
| 4,896,719 A | 1/1990 | O'Neill et al. | 165/170 |
| 4,908,112 A | 3/1990 | Pace | 204/299 R |
| 4,938,280 A | 7/1990 | Clark | 165/80.4 |
| 4,978,638 A | 12/1990 | Buller et al. | 437/209 |
| 5,199,487 A | 4/1993 | DiFrancesco et al. | |
| 5,210,680 A * | 5/1993 | Scheibler | 361/695 |
| 5,718,628 A | 2/1998 | Nakazato et al. | |
| 6,012,902 A | 1/2000 | Parce | |
| 6,431,260 B1 | 8/2002 | Agonafer et al. | |
| 6,651,452 B2 | 11/2003 | Lecke et al. | |
| 6,775,137 B2 | 8/2004 | Chu et al. | |
| 6,787,052 B1 | 9/2004 | Vaganov | |
| 6,819,563 B1 | 11/2004 | Chu et al. | |
| 6,896,612 B1 | 5/2005 | Novotny | |

(Continued)

FOREIGN PATENT DOCUMENTS

DE 3314069 A 11/1986

(Continued)

*Primary Examiner*—Boris L Chervinsky
(74) *Attorney, Agent, or Firm*—Haverstock & Owens LLP

(57) ABSTRACT

A duct work assembly is coupled to an end of an electronics enclosure that houses one or more heat generating devices, such as electronics servers. The duct work assembly includes individual duct guides that each have a deformable end, which is configured to locally deform around the electrical connection lines extending from the rear of one or more electronics servers. The deformable end can be made of bristles, as in a brush, or foam that includes slits and/or holes.

12 Claims, 9 Drawing Sheets

U.S. PATENT DOCUMENTS

| | | | |
|---|---|---|---|
| 6,924,981 B2 | 8/2005 | Chu et al. | |
| 6,973,801 B1 | 12/2005 | Campbell et al. | |
| 7,018,169 B2 * | 3/2006 | Phillip et al. | 415/60 |
| 7,051,802 B2 | 5/2006 | Baer et al. | |
| 7,112,131 B2 * | 9/2006 | Rasmussen et al. | 454/184 |
| 7,295,444 B1 | 11/2007 | Wang | |
| 7,355,850 B2 * | 4/2008 | Baldwin, Jr. | 361/695 |
| 7,382,613 B2 * | 6/2008 | Vinson et al. | 361/679.48 |
| 7,385,810 B2 | 6/2008 | Chu et al. | |
| 7,420,806 B1 * | 9/2008 | Lima et al. | 361/695 |
| 7,430,118 B1 | 9/2008 | Noteboom et al. | |
| 7,434,412 B1 | 10/2008 | Miyahira | |
| 7,436,663 B2 * | 10/2008 | Matsushima et al. | 361/695 |
| 7,539,020 B2 | 5/2009 | Chow et al. | |
| 2002/0039279 A1 | 4/2002 | Ishikawa et al. | |
| 2002/0079095 A1 | 6/2002 | Davies et al. | |
| 2003/0077474 A1 | 4/2003 | Rabinkin et al. | |
| 2003/0128508 A1 | 7/2003 | Faneuf et al. | |
| 2005/0061013 A1 | 3/2005 | Bond | |
| 2005/0243516 A1 | 11/2005 | Stefanoski et al. | |
| 2006/0245987 A1 | 11/2006 | Bond | |
| 2007/0201210 A1 | 8/2007 | Chow et al. | |
| 2007/0211428 A1 | 9/2007 | Doll | |
| 2008/0205003 A1 | 8/2008 | Belady | |
| 2008/0285228 A1 | 11/2008 | Koch et al. | |

FOREIGN PATENT DOCUMENTS

| | | |
|---|---|---|
| DE | 29717480 U1 | 2/1998 |
| DE | 35406777 1 | 1/2001 |
| EP | 1153690 A1 | 11/2001 |
| JP | 5304383 AA | 11/1993 |
| TW | 183247 | 5/1992 |
| TW | 49131 | 6/2002 |
| WO | 2005080901 A1 | 9/2005 |
| WO | 2007006590 A2 | 1/2007 |

* cited by examiner

DEFORMABLE DUCT GUIDES THAT ACCOMMODATE ELECTRONIC CONNECTION LINES

RELATED APPLICATIONS

This application claims priority of U.S. provisional application Ser. No. 60/964,025, filed Aug. 7, 2007, and entitled "Method and Apparatus for Providing Supplemental Cooling to Server Racks", by these same inventors. This application incorporates U.S. provisional application Ser. No. 60/964,025 in its entirety by reference.

FIELD OF THE INVENTION

The invention relates to duct work in general, and specifically, to duct work configured for pass-through of electrical connection lines.

BACKGROUND OF THE INVENTION

Cooling of high performance integrated circuits with high heat dissipation is presenting significant challenge in the electronics cooling arena. Conventional cooling with heat pipes and fan mounted heat sinks are not adequate for cooling chips with every increasing wattage requirements, including those exceeding 100 W.

Electronics servers, such as blade servers and rack servers, are being used in increasing numbers due to the higher processor performance per unit volume one can achieve. However, the high density of integrated circuits also leads to high thermal density, which is beyond the capability of conventional air-cooling methods.

A particular problem with cooling integrated circuits on electronics servers is that multiple electronics servers are typically mounted in close quarters within a server chassis. In such configurations, electronics servers are separated by a limited amount of space, thereby reducing the dimensions within which to provide an adequate cooling solution. Typically, stacking of electronics servers does not provide the mounting of large fans and heat sinks for each electronics server. Often each server within an electronics enclosure is cooled by a dedicated internal fan. For blade server applications, groups of blade servers are cooled by one or more internal fans dedicated to each group of blade servers. Using such configurations, the integrated circuits on each electronics server are cooled using fans that blow air over the integrated circuits on the electronics servers. However, considering the limitations of the internal fans within the server rack, the amount of air available for cooling the integrated circuits is limited.

Supplemental cooling is provided by Computer Room Air Conditioning (CRAC) units external to the electronics enclosure. Cooled air is vented through the electronics enclosure, entering from one side of the chassis and exiting an opposite side. As data centers continue to increase their computer density, electronics servers are being deployed more frequently. Fully populated electronics servers significantly increase rack heat production. This requires supplemental cooling beyond what the CRAC units can provide. Supplemental cooling systems may include fans, pump, and heat exchangers located outside the back end of the electronics server to decrease the air temperature exiting the electronics server. The heat exchangers in these supplemental cooling systems are supplied with pumped coolants, water, or refrigerants. Some supplemental cooling systems are configured as a "cooling door" that is attached to the back of an electronics enclosure. However, for some electronics enclosure there is typically uneven heat load throughout the electronics enclosure, which often leads to inadequate cooling of certain areas within the electronics enclosure, even when conventional supplemental cooling systems are used.

SUMMARY OF THE INVENTION

Cooling systems of the present invention are directed to a re-configurable duct work assembly for a server rack or other electronics enclosure. In some embodiments, a front door, a rear door, or both the front and rear doors of the electronics enclosure are configured as cooling doors including one or more heat exchangers. In other embodiments, the front door and/or the rear door of the electronics enclosure is replaced by a plurality of movable segments that enable access to the interior of the electronics enclosure. Each segment includes one or more heat exchangers.

A plurality of heat generating devices, such as electronics servers, are positioned within the electronics enclosure. The heat exchangers are coupled to the electronics servers via the duct work. The duct work is positioned within a plenum between the back of the electronics servers and the heat exchangers. In most applications, a heat load within the electronics enclosure is not evenly distributed. Typically, each electronics server, or groups of adjacent electronics servers within the electronics enclosure, generate a different heat load than other electronics servers, or groups of adjacent electronics servers. As such, the heat load per unit volume is not constant within the electronics enclosure. The interior of the electronics enclosure is conceptually segmented into heat zones. In some embodiments, each heat zone has an equal thermal output, and the duct work is used to direct an equal amount of heated air to each of the heat exchangers, or in the case of a single heat exchanger, to evenly distribute heated air across the heat exchanger. In some embodiments, the heated air output from a single heat zone is directed by the duct work to a corresponding single heat exchanger. In other embodiments, the heated air output from a group of adjacent heat zones is combined within a single duct work guide that directs the combined heated air to a corresponding number of adjacent heat exchangers.

The rear door including the one or more heat exchangers is configured to provide access to the cables and equipment located within the electronics enclosure. Such access can be provided by swinging the door open on hinges like a standard door. In the case where there are multiple heat exchangers, the door can be configured into segments, one segment per heat exchanger, and each segment includes hinges so as to be opened independently from the other segments. Such a configuration reduces the cooling disruption to the other electronics servers within the electronics enclosure. In some embodiments, each segment swivels open like a standard door. In other embodiments, each segment is configured to swivel up or down. In still other embodiments, each segment is configured to be disconnected from the electronics enclosure and moved out of the way, in which case each heat exchanger is connected using either flexible tubing that can be bent out of the way or quick disconnects. In other embodiments, the entire rear door, or each segment of the rear door, can be configured to slide open and closed like a drawer.

In some embodiments, individual duct guides are configured with a deformable end that is configured to locally deform around the electrical connection lines extending from the rear of one or more electronics servers. The deformable end can be made of bristles, as in a brush, or foam that includes slits and/or holes.

Other features and advantages of the present invention will become apparent after reviewing the detailed description of the embodiments set forth below.

BRIEF DESCRIPTION OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Figure 1:
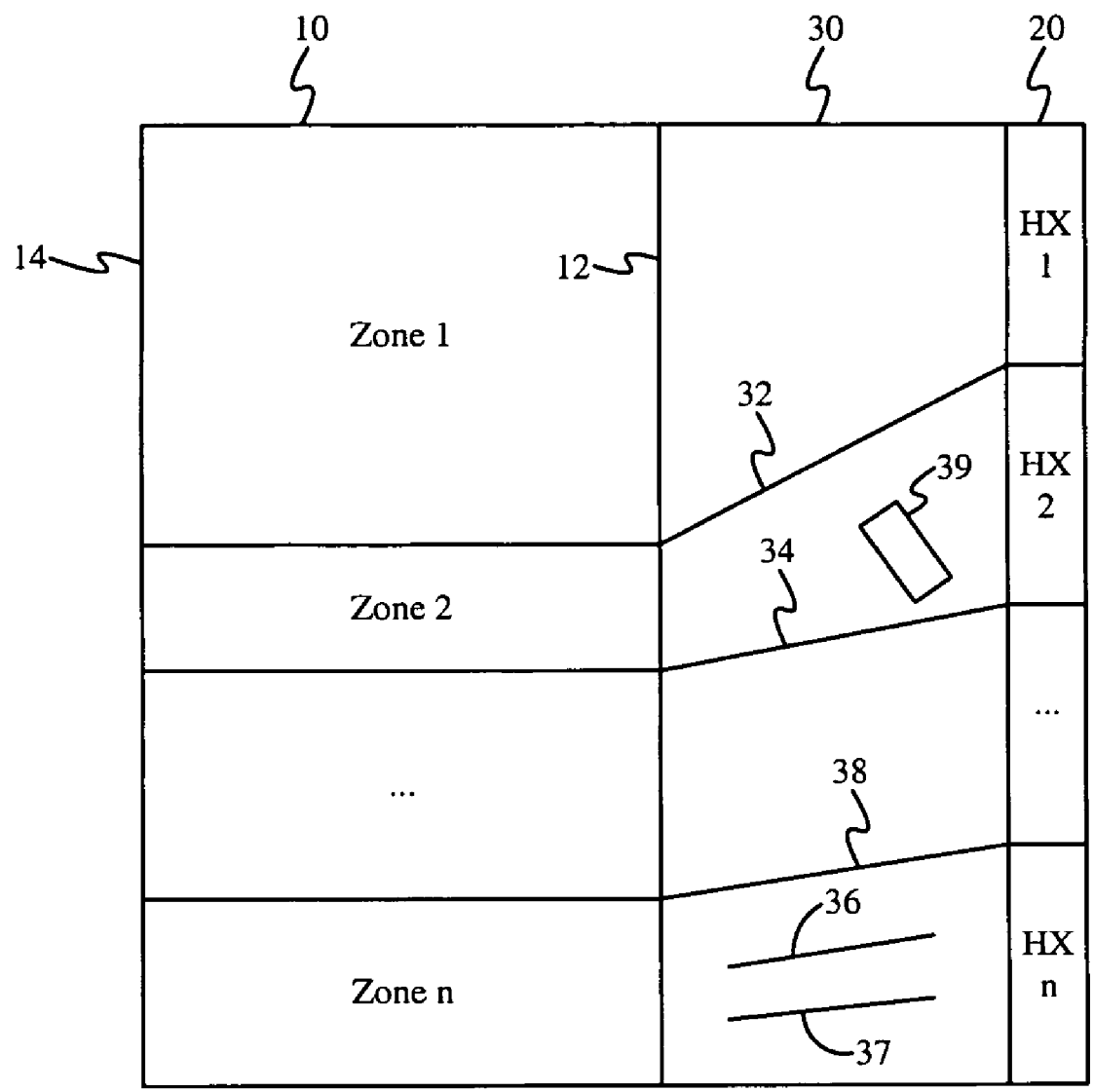
FIG. 1 illustrates a cut out side view of an electronics enclosure coupled to a duct work assembly according to an embodiment of the present invention.

Reference will now be made in detail to the embodiments of the cooling system of the invention, examples of which are illustrated in the accompanying drawings. While the invention will be described in conjunction with the embodiments below, it will be understood that they are not intended to limit the invention to these embodiments and examples. On the contrary, the invention is intended to cover alternatives, modifications and equivalents, which may be included within the spirit and scope of the invention as defined by the appended claims. Furthermore, in the following detailed description of the present invention, numerous specific details are set forth in order to more fully illustrate the present invention. However, it will be apparent to one of ordinary skill in the prior art that the present invention may be practiced without these specific details. In other instances, well-known methods and procedures, components and processes haven not been described in detail so as not to unnecessarily obscure aspects of the present invention.

Embodiments of the present invention are directed to a cooling system that transfers heat generated by one or more electronics servers within an electronics enclosure or server rack, collectively referred to herein as an electronics enclosure. The cooling system described herein can be applied to any electronics system or sub-system that is mounted to a rack, including but not limited to, a blade server, a rack server, and a storage server, herein referred to collectively as an electronics server. An electronics enclosure is configured to house multiple electronics servers. Each electronics server includes one or more heat generating devices as is well known in the art.

The cooling system utilizes the air flow generated by the internal fans included as part of the electronics servers. The interior of the electronics enclosure is conceptually partitioned into heat zones. In some embodiments, the thermal load in each heat zone is equal. Due to the unique heat generating qualities of each of the electronics servers within the electronics enclosure, the heat zones may or may not be of equal size by volume. For example, a first heat zone with a first volume may have a larger volume than a second heat zone with a second volume. A duct work assembly is coupled to an air out flow side of the electronics servers. Duct guides are positioned within a plenum between the back of the electronic servers and the heat exchangers. The duct work assembly includes a plurality of duct guides positioned to selectively guide the output air flow from the electronics servers to one or more heat exchangers. In some embodiments, the air flow output from one heat zone is directed by the duct guides to a single heat exchanger. In other embodiments, the air flow output from multiple adjacent heat zones, such as N heat zones, is combined into common duct work and collectively directed to a corresponding number of adjacent heat exchangers, such as N heat exchangers. In still other embodiments, there is not a one-to-one relationship between the number of heat zones and the number of heat exchangers. In general, the interior of the electronics enclosure is conceptually partitioned into M heat zones, and the cooling panel includes N heat exchangers. The duct guides are adjustably positioned to selectively direct heated air from one or more heat zones to one or more heat exchangers. In some cases, duct guides are positioned to direct air to portions of one or more heat exchangers, essentially segmenting the heat exchangers and directing different air flows to different segments of the same heat exchangers.

In general, the duct work assembly directs heated air from conceptualized heat zones within the electronics enclosure to heat exchangers. As opposed to uniformly directing heated air, which has a non-uniform thermal load distribution, to one or more heat exchangers, the duct work assembly provides more cooling to areas of higher thermal load by directing the heated air output from the higher thermal load areas to greater relative cross-sectional areas of the heat exchangers. In other words, the cooling capacity of the heat exchanges is more targeted to cooling the hotter areas within the electronics enclosure.

FIG. 1 illustrates a cut out side view of an electronics enclosure 10 coupled to a duct work assembly 30 according to an embodiment of the present invention. The electronics enclosure 10 includes a plurality of heat generating devices (not shown), such as electronics servers. The electronics enclosure 10 is configured to enable airflow from a first side 14 to a second side 12. The first side 14 and the second side 12 are configured with air vents to enable air flow. The air vents can be gratings, mesh, vertical slats, horizontal slats, or any other type of opening in the electronics enclosure siding to allow air flow. Such openings can refer to multiple openings within a side panel structure, or an opening can be an open space framed by the ends of the side, top, and bottom panels of the electronics enclosure 10. In general, the term "air vent" refers to one or more openings in a side panel structure or to an open space where a side panel structure is not present. Air flows from the first side 14 of the electronics enclosure 10 to the second side 12. The air flow through the electronics enclosure 10 is generated by an internal air moving system (not shown) positioned within the electronics enclosure 10, for example an internal fan, and/or within each of the electronics servers or group of electronics servers. Air is drawn into the electronics enclosure 10 through the first side 14. The air flows over the heat generating devices within the electronics enclosure 10, thereby heating the air. The heated air flows out the second side 12 of the electronics enclosure 10 and into the duct work assembly 30.

A first end of the duct work assembly 30 is coupled to the second side 12 of the electronics enclosure 10, and a second end of the duct work assembly 30 is coupled to a cooling panel 20. The cooling panel 20 includes one or more heat exchangers. In the exemplary configuration of FIG. 1, there are N heat exchangers, indicated as heat exchanger 1, heat exchanger 2, ..., heat exchanger N. In some embodiments, the cooling panel 20 is a cooling door.

Figure 3:
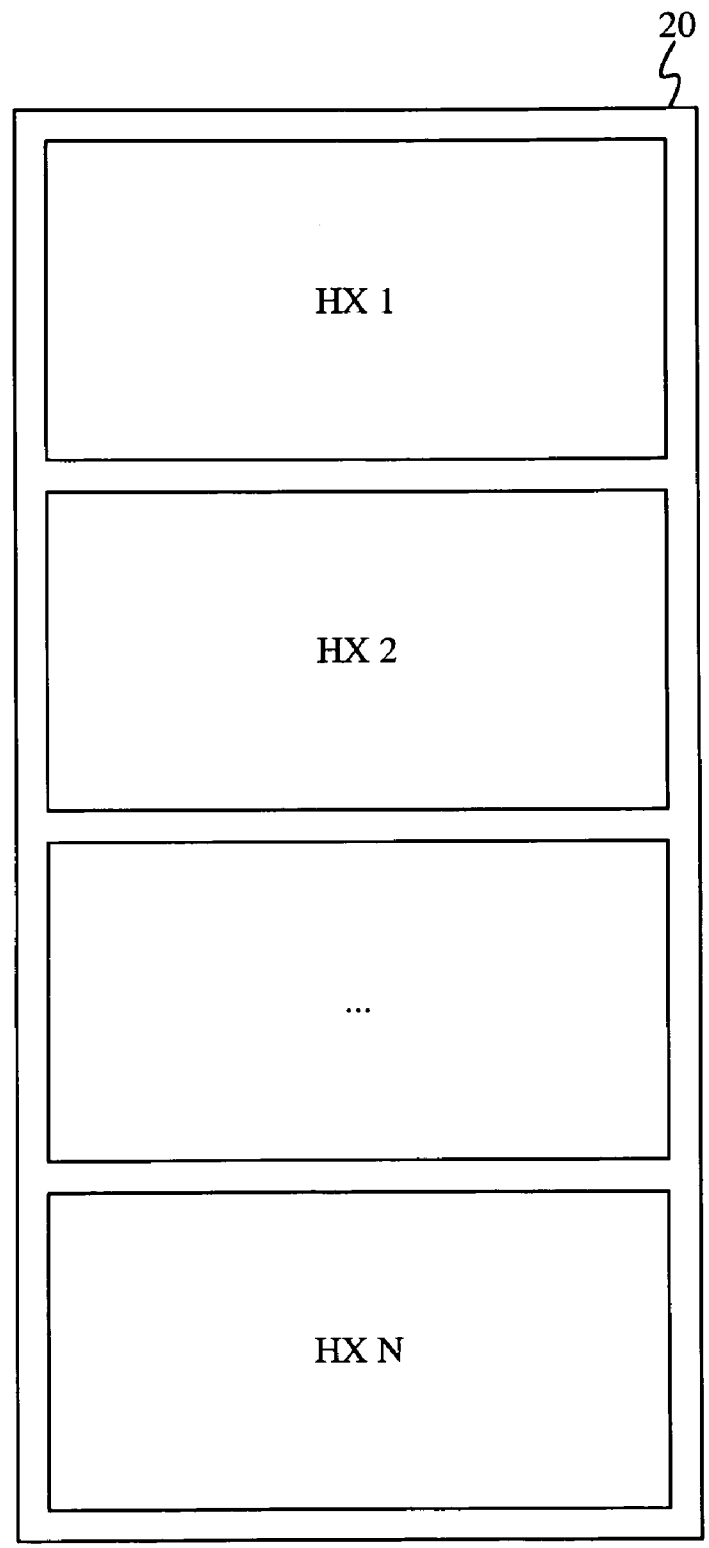
FIG. 3 illustrates a front view of the cooling panel of FIG. 1.

FIG. 3 illustrates a front view of the cooling panel 20 of FIG. 1. The cooling panel 20 in FIG. 3 includes the N heat exchangers 1, 2, ..., N. Each heat exchanger 1, 2, ..., N has a coolant flowing therethrough. As the heated air flows through the heat exchangers 1, 2, ..., N in the cooling panel 20, heat is transferred from the air to the coolant flowing through the heat exchangers 1, 2, ..., N, thereby cooling the air exiting the cooling panel 20. In some embodiments, the cooling panel 20 is coupled to an external cooling system (not shown) that supplies coolant to and returns heated coolant from the cooling panel 20. The external cooling system can include a cooling tower, a chiller, or other secondary cooling loop including a heat exchanger used to cool the coolant exiting the cooling panel 20. Water, refrigerant, or any other coolant is used. In some embodiments, the coolant is a two-phase coolant. In other embodiments, the coolant is a single-phase coolant.

In some embodiments, the heat exchangers are made of a micro-tube construction with attached air fins or of a tube-fin type of design. In other embodiments, the heat exchangers are any conventional heat exchangers that use air flow for transferring heat. The cooling panel 20 can include a single large heat exchanger or a group of heat exchangers attached in parallel or series. Separate heat exchangers are more manageable to construct and provide better control of fluid distribution. The heat exchangers 1, 2, ..., N are shown in FIGS. 1 and 3 as panels stacked one on top of another. It is understood that such a configuration is for exemplary purposes only and that each heat exchanger can be configured in a different shape than the panel configuration shown in FIG. 3, and can be positioned in different patterns than the stacked pattern shown in FIGS. 1 and 3.

Referring again to FIG. 1, the interior of the electronics enclosure 10 is conceptually partitioned into heat zones. The electronics enclosure 10 as a whole generates a total thermal load output Q. However, due to the unique configuration and use of each individual electronics server stored in the electronics enclosure 10, the thermal load throughout the interior of the electronics enclosure 10 is not homogeneous. In some embodiments, each heat exchanger 1, 2, ..., N is configured to cool a same thermal load. In this case, each heat exchanger cools a fractional equivalent of 1/N of the total thermal load Q output from the electronics enclosure 10. To enable this performance, a same amount of thermal load, via heated air output from the second side 12 of the electronics enclosure 10, is directed to each of the heat exchangers 1, 2, ..., N. To partition the total thermal load Q output from the second side 12 into equivalent amounts to be directed to each heat exchanger 1, 2, ..., N, the interior of the electronics enclosure 10 is conceptually partitioned into heat zones, where each heat zone defines a specific volume within the electronics enclosure 10. In this exemplary case, each heat zone is conceptually partitioned to have an equivalent thermal load. As such, the heated air output from one heat zone has the same thermal load as the heated air output from another heat zone, however the volume of each heat zone may be different. The heated air from each heat zone is directed to a corresponding one of the heat exchangers 1, 2, ..., N, via duct guides within the duct work assembly 30.

As the size of the heat zones is not uniform, the positions of the duct guides within the duct work assembly 30 are also non-uniform, as the position of each duct guide is individually determined according to the size and location of the corresponding heat zone and the heat exchanger to which the heated air is to be directed. In the exemplary configuration of FIG. 1, heat zone 1 has a larger volume than both the heat zone 2 and the heat zone N, and the heat zone N has a larger volume than the heat zone 2. As such, the thermal load per unit volume is greater in heat zone 2 than in both the heat zone 1 and the heat zone N, and the thermal load per unit volume is greater in the heat zone N than in the heat zone 1.

A duct guide 32 is positioned to direct heated air output from the heat zone 1 to the heat exchanger 1. The duct guide 32 is also used along with a duct guide 34 to direct heated air output from the heat zone 2 to the heat exchanger 2, as the heat zone 2 is adjacent to the heat zone 1. Similarly, the duct guide 34 is used along with another duct guide (not shown) to direct air from a heat zone 3 (not shown) to a heat exchanger 3 (not shown), as the heat zone 3 is adjacent to the heat zone 2. A duct guide 38 is positioned to direct heated air output from the heat zone N to the heat exchanger N. In some embodiments, each of the duct guides 32, 34, 38 are substantially planer elements that span the distance between the two side panels of the duct assembly 30 and also span the distance between the electronics enclosure 10 and the cooling panel 20. Alternatively, the duct guides can be curved. In some embodiments, each of the duct guides span the distance between the cooling panel 20 and the rear of the electronics servers within the electronics enclosure 10.

In some embodiments, each heat exchanger 1, 2, ..., N is configured to cool the same thermal load Q/N. If the thermal load within the electronics enclosure 10 were evenly distributed, each conceptual heat zone 1, 2, ..., N would be the same size, a cross-section of each would be the same area as a cross-section of each heat exchanger 1, 2, ..., N. In this even distribution configuration, each heat zone is referred to a baseline heat zone. In comparison to the heat zones shown in FIG. 1, the heat zone 1 is larger than the baseline heat zone. The duct work associated with a heat zone that is larger than the baseline heat zone, such as the heat zone 1, funnels the heated air output from the larger heat zone to a relatively smaller cross-sectional area at the heat exchanger. In this case, the air flow rate of the heated air is increased as it moves toward the heat exchanger. In contrast, each of the heat zone 2 and the heat zone N are smaller than the baseline heat zone.

The duct work associated with a heat zone that is smaller than the baseline heat zone, such as the heat zones 2 and N, direct the heated air output from the smaller heat zones to a relatively larger cross-sectional area at the heat exchanger. In this case, the air flow rate of the heated air is decreased as it moves toward the heat exchanger.

Additional duct work elements, such as duct guides, channels, and/or air dams, can be added within the duct guide assembly. The additional duct work elements can be used, for example, to regulate air flow and to make air flow homogeneous through one or more corresponding heat exchangers. For example, an air dam 39 is positioned between the duct guides 32 and 34 to reduce the rate of air flow from the heat zone 2 to the heat exchanger 2. In some embodiments, an air dam is configured as a solid, non-porous structure where air is completely blocked and forced to flow around the air dam structure. In other embodiments, an air dam is configured as a porous structure that enables partial air flow through the air dam structure. The porous nature of the air dam structure provides some degree of air flow blockage, thereby providing a degree of air flow regulation not provided without the air dam. In still other embodiments, an air dam is adjustable between non-porous and various degrees of porous. The adjustable air dam structure is adjusted to allow various degrees of air flow through the structure, similar in concept to how adjustable window blinds are adjusted to allow various degrees of light to pass through.

As another example of additional duct work elements that can be used, duct guides 36 and 37 are added between the duct guide 38 and the bottom panel of the duct work assembly 30 to further refine the air flow alignment directed at the heat exchanger N. The additional duct guides 36 and 37 can also be used to minimize, if not eliminate, re-circulation zones that may exist.

Figure 2A:
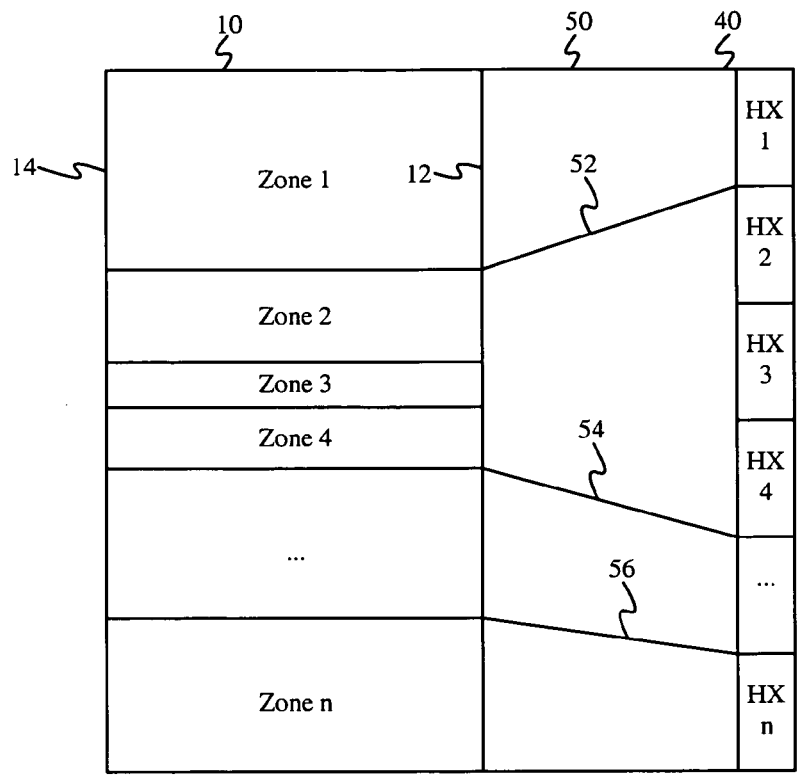
FIG. 2A illustrates a cut out side view of the electronics enclosure coupled to a duct work assembly according to another embodiment of the present invention.

In some embodiments, the heated air output from multiple adjacent heat zones can be combined into a common duct work and directed to a group of adjacent heat exchangers. FIG. 2A illustrates a cut out side view of the electronics enclosure 10 coupled to a duct work assembly 50 according to another embodiment of the present invention. The configuration of FIG. 2A is similar to that of FIG. 1 except that in FIG. 2A the thermal load distribution within the electronics enclosure 10 is different and the duct work assembly 50 uses common duct work, a duct guide 52 and a duct guide 54, to combine heated air output from multiple adjacent heat zones 2, 3, and 4, to multiple adjacent heat exchangers 2, 3, and 4. In this exemplary configuration, each heat zone is not independently ducted to a corresponding one heat exchanger. Other heat zones can be similarly combined, or can be independently ducted, such as the heated air output from the heat zone N being directed to the heat exchangers N by duct guide 56. Additional duct guides, channels, and/or air dams can be used within each ducted pathway. Although FIG. 2A shows the combination of heated air output from three adjacent heat zones within a common duct work, it is understood that heated air from more or less than three adjacent heat zones can be combined within a common duct work.

In use, the electronics servers within the electronics enclosure are periodically changed or updated, thereby resulting in a changed thermal load distribution within the electronics enclosure. While the heat exchangers and the duct work assembly can be initially configured to match a specific thermal load distribution corresponding to an initial configuration of electronics servers, once any one of the electronics servers are changed, the thermal load distribution changes, and so do the optimal air flow characteristics to meet this new thermal load distribution. Since the positions of the duct guides are changeable, the duct work assembly as a whole is adaptable to changing thermal conditions within the electronics enclosure. In general, if the thermal load conditions within the electronics enclosure change, such as for example the swapping out of one or more electronics servers for other electronics servers with different thermal load profiles, the heat zones can be re-defined, and the duct guides re-positioned within the duct work assembly according to the newly defined heat zones.

The cooling systems of FIGS. 1 and 2A are described in terms of conceptually partitioning the interior of the electronics enclosure into heat zones having equivalent thermal loads, and for establishing a 1:1 or N:N relationship between the ducting of heated air from the heat zones to corresponding heat exchangers. It is alternatively contemplated that there is not a one-to-one relationship between the number of heat zones and the number of heat exchangers. As previously described, the interior of the electronics enclosure is conceptually partitioned into M heat zones, and the cooling panel includes N heat exchangers. In some cases, duct guides are positioned to direct air to portions of one or more heat exchangers, essentially segmenting the heat exchangers and directing the different air flows to different segments of the same heat exchangers.

Figure 2B:
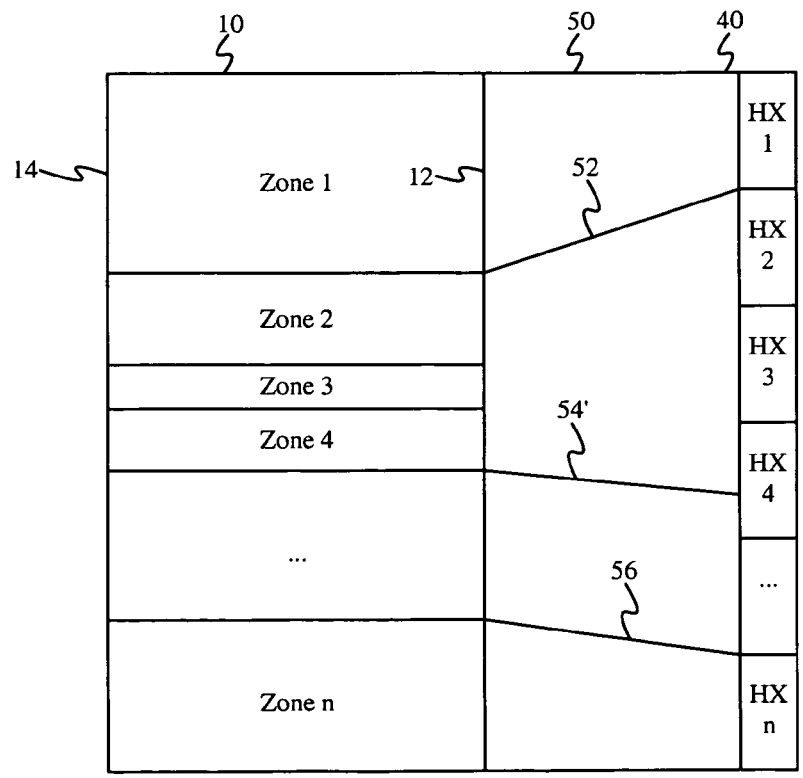
FIG. 2B illustrates a cut out side view of the electronics enclosure coupled to a duct work assembly according to yet another embodiment of the present invention.

FIG. 2B illustrates the electronics enclosure 10 configured as in FIG. 2A except that the duct guide 54 of FIG. 2A is re-positioned as duct guide 54' in FIG. 2B such that air is directed to a portion of the heat exchanger 4.

In some embodiments, the duct guides are made of a deformable material, such as foam or sponge, including holes and/or slits, or brush including stiff bristles to allow electrical connection lines, such as cables or cords, to pass through the duct guide material. In other embodiments, the duct guides are made of a combination of materials including a rigid portion and a deformable portion, such as a metal or plastic sheet with bristles attached to one of the ends to allow cable pass-though. The duct guides are configured to be removable and their positions adjustable to adapt to changes in the heat load distribution within the electronics enclosure, such as due to replacement of one or more electronics servers with electronics servers that have different heat generating profiles. In some embodiments, the cooling panel, the back end of the electronics enclosure, and/or the plenum in between is configured with mechanical means for holding the duct guides in place. Examples of such mechanical means includes slots, flanges, and screws. In other embodiments, the duct guide itself is fitted with mechanical means for support that mate to corresponding features on the electronics enclosure. A duct guide can be positioned anywhere in the duct work assembly that provides or can accept the mechanical means for supporting the duct guide in position. The available positions for the duct guides are only limited by the number and variety of the mechanical means for support that are provided.

In some embodiments, the deform able nature of the duct guide provides the mechanical means for holding the duct guide in place. For example, the duct guide is made of foam that is compressible, which for example is 26 inches wide in an uncompressed state. To install the duct guide within the electronics enclosure, which for example is 24 inches wide, the foam is compressed and placed in position within the electronics enclosure while compressed, then the compression is released. The action of the foam expanding back towards it original form provides pressure against the electronics enclosure, thereby holding the foam duct guide in place. A deformable duct guide of this type can be positioned anywhere within the duct work assembly.

Figure 10:
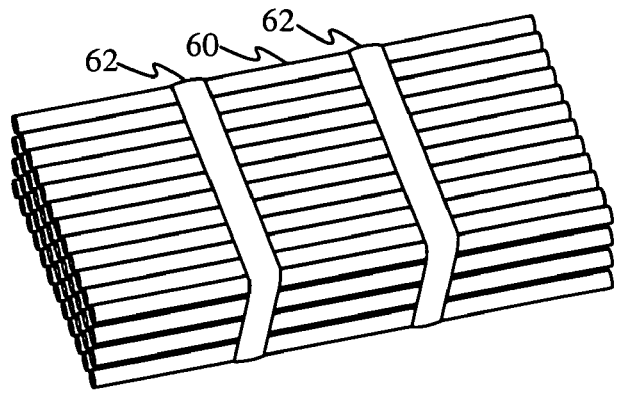
FIG. 10 illustrates an exemplary duct guide comprising bristles.
Figure 11:
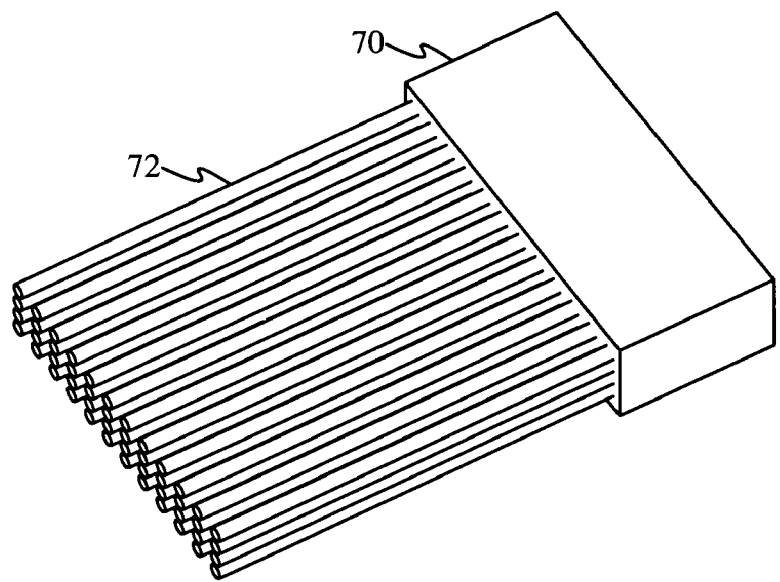
FIG. 11 illustrates an exemplary duct guide comprising bristles coupled to a rigid structure, where the bristles form a majority of the duct guide.
Figure 12:
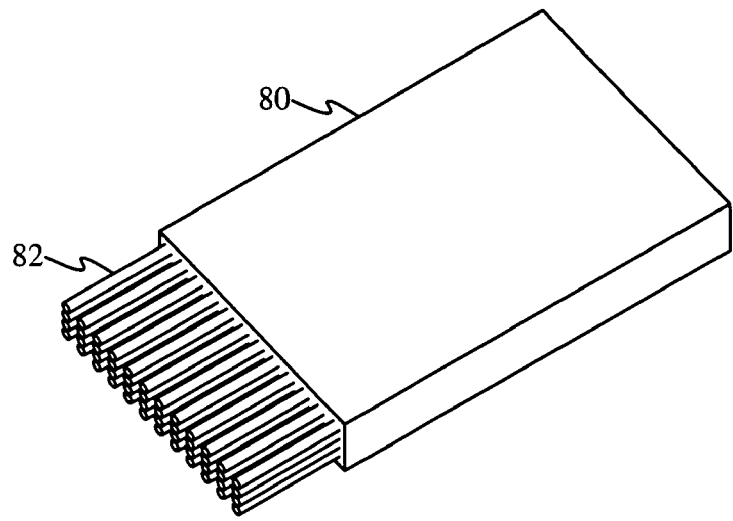
FIG. 12 an exemplary duct guide comprising bristles coupled to a rigid structure, where the bristles form a minority of the duct guide.

Another advantage of the deformable aspect of the duct guides is to accommodate all the electrical connection lines connected to the back of the electronics servers. The deformable duct guides, or the deformable portions of the duct guides, enable the electrical connection lines to pass through the duct guide while still maintaining the capability of guiding the air flow. In an exemplary configuration, a duct guide is made of stiff bristles. FIG. 10 illustrates an exemplary duct guide comprising bristles 60. Optional bindings or straps 62 can be used to bind the bristles together. Where the bristles impinge the electrical connection lines at the back end of the electronics servers, the bristles deform around the electrical connection lines. Alternatively, the electrical connection lines can be manually positioned to drape across the duct guide and pass through the bristles at the end proximate the cooling panel. FIG. 11 illustrates an exemplary duct guide comprising bristles 72 coupled to a rigid structure 70, where the bristles 72 form a majority of the duct guide. FIG. 12 an exemplary duct guide comprising bristles 82 coupled to a rigid structure 80, where the bristles 82 form a minority of the duct guide. It is understood that other proportions of bristles to rigid structure than those shown in FIGS. 11 and 12 can be used. In some embodiments, the duct guide is positioned such that the bristled end faces the electronics servers. In other embodiments, the duct guide is positioned such that the bristle end faces the cooling panel. In this case, the electrical connection lines drape over the duct guide and pass through the bristles facing the cooling panel.

Figure 13:
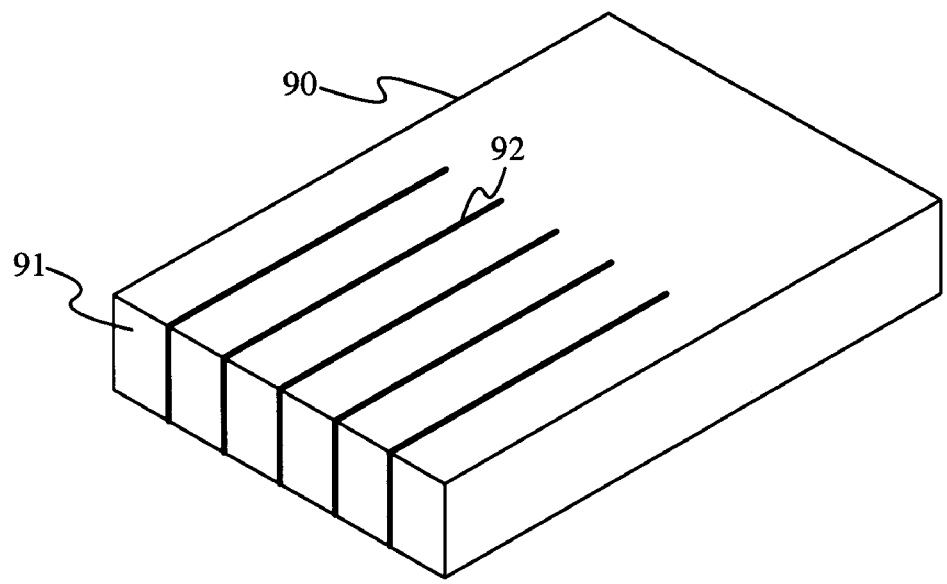
FIG. 13 illustrates an exemplary duct guide comprising foam having slits.
Figure 14:
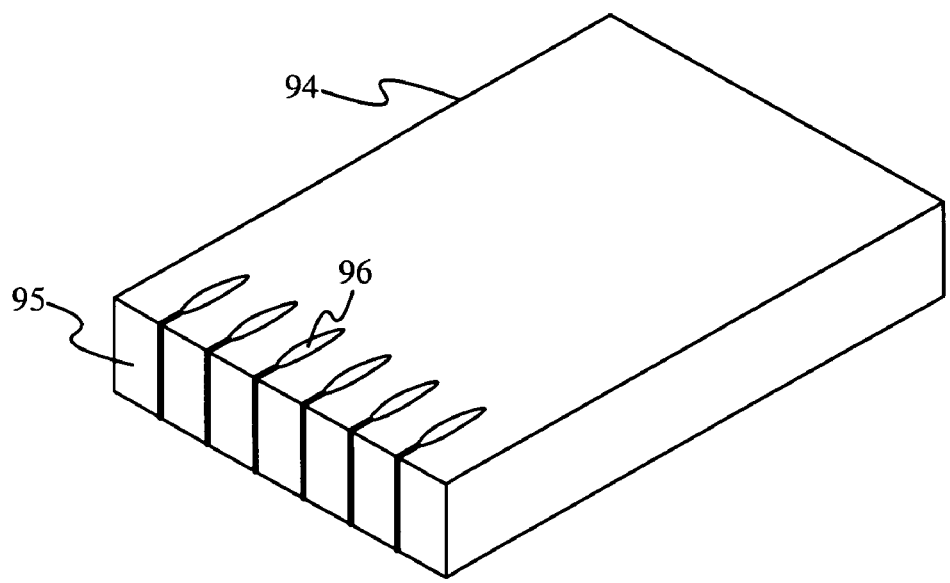
FIG. 14 illustrates an exemplary duct guide comprising foam having holes.

In another exemplary configuration, a duct guide is made of a deformable material, such as foam, with slits, holes, or a combination of slits and holes. The electrical connection lines either slide within the slits or into the holes cut into one end of the foam. FIG. 13 illustrates an exemplary duct guide comprising foam 90 having slits 92. The slits 92 extend through the entire thickness of the foam 90 and extend from an end 91 along a partial length of the foam 90. FIG. 14 illustrates an exemplary duct guide comprising foam 94 having slits with a hole 96 at the end of each slit. The holes 96 extend through the entire thickness of the foam 94. In an alternative configuration, a foam duct guide includes holes, but no slits. As with the bristle duct guides, the foam duct guides can be positioned such that the end with the slits is positioned facing either the electronics servers or the cooling panel.

For those implementations where the distance between the second side 12 (FIG. 1) and the heat exchangers is relatively short, for example less than or equal to 12 inches, a single duct guide can be used to span the entire gap. The duct guide can be attached on the heat exchanger side, such as on the cooling panel 20 (FIG. 1), and when the cooling panel is shut, wherever cords or cables are present at the electronics server side, such as the second side 12 (FIG. 1), the cords and cables locally impede the deformable material, which bends to accommodated. The remaining deformable material not impeded by the cords and cables remains in place.

For those implementations where the distance between the second side 12 and the heat exchangers is relatively long, for example greater than 12 inches, two separate duct guides can be used to span the entire gap. A first duct guide is rigid and is attached on the heat exchanger side, such as the cooling panel 20. A second duct guide is either deformable, or a combination of rigid and deformable, and is attached on the electronics enclosure side. The deformable second duct guide, or the deformable portion of the second duct guide, deforms about the electrical connection lines. When the cooling panel is shut, the ends of the first and second duct guide abut or slightly overlap, to conceptually form a substantially single duct guide that spans the distance between the electronics servers and the heat exchangers. Both the first and second duct guides can be re-positioned as described above.

FIGS. 1 and 2 show the cooling panel 20, 40 and the electronics enclosure 10 with a 1:1 relationship between the number of heat exchangers in the cooling panel and the number of heat zones in the electronics enclosure. It is understood that the cooling panel and the electronics enclosure can be configured with alternative relationships. In general, the ratio between the number of heat exchangers and the number of heat zones is 1:n.

Each of the heat exchangers are described above as being configured to cool the same amount of thermal load and each heat zone is conceptually defined as generating the same amount of thermal load. In alternative configurations, each heat exchanger can be configured to cool an independent amount of thermal load, as compared to the other heat exchangers, and the heat zones can be conceptually defined according to unequal thermal loads. Each heat exchanger can vary by size and/or density of heat exchanging elements. The duct work assembly is re-configurable to adjust the positions and numbers of duct guides to alter the air flow according to any desired configuration and specifications as determined by the thermal load distribution within the electronics enclosure and the configuration of each of the heat exchangers.

Although the electronics enclosure, the duct work assembly, and the cooling panel with heat exchanger(s) are described above as separate components, it is understood that the duct work assembly can be integrated as part of the electronics enclosure and/or as part of the cooling panel. Also, the cooling panel, configured with or without the duct work assembly, can be integrated as part of the rear panel of the electronics enclosure. In the case where there is no duct work assembly, the electronics enclosure is configured with a rear plenum within which the duct guides can be positioned.

In conventional electronics enclosures, the rear panel is configured as a door to enable access to the internal electronics servers. However, when the rear panel or door is configured with heat exchangers that are coupled to external fluid supply lines, and in some cases the inclusion of a duct work assembly of the type described above, alternative means for accessing the interior of the electronics enclosure are used.

Figure 4:
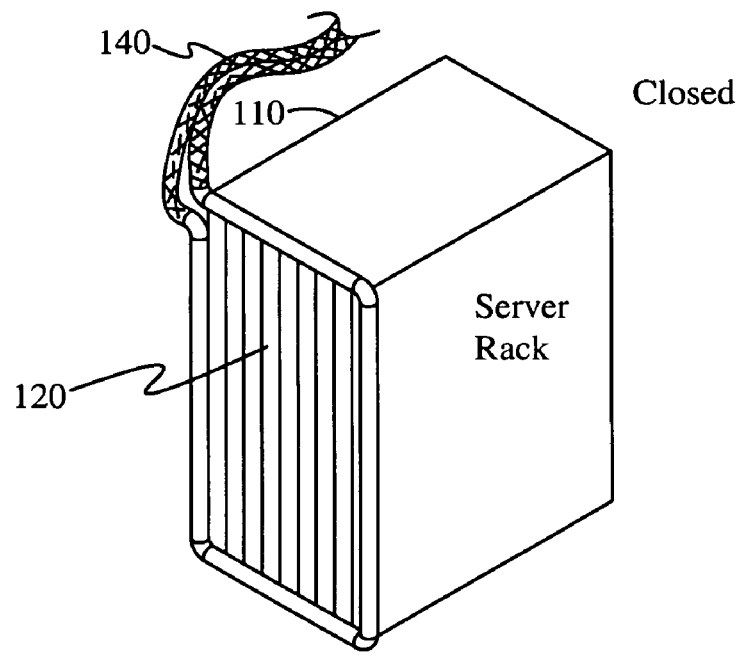
FIG. 4 illustrates an isometric view of an electronics enclosure with a first embodiment of an access mechanism in a closed position.

FIG. 4 illustrates an isometric view of an electronics enclosure with a first embodiment of an access mechanism in a closed position. An electronics enclosure 110 includes a rear panel 120 including one or more heat exchangers. The one or more heat exchangers are coupled to flexible fluid lines 140 for input and output of cooling fluid. In some embodiments, the electronics enclosure 110 includes a plenum and duct work of the type described above in relation to FIGS. 1-3. In other embodiments, the electronics enclosure 110 may or may not include a plenum and/or duct work between the back of the electronics servers 160 (FIG. 5A) and the rear panel 120.

Figure 5A:
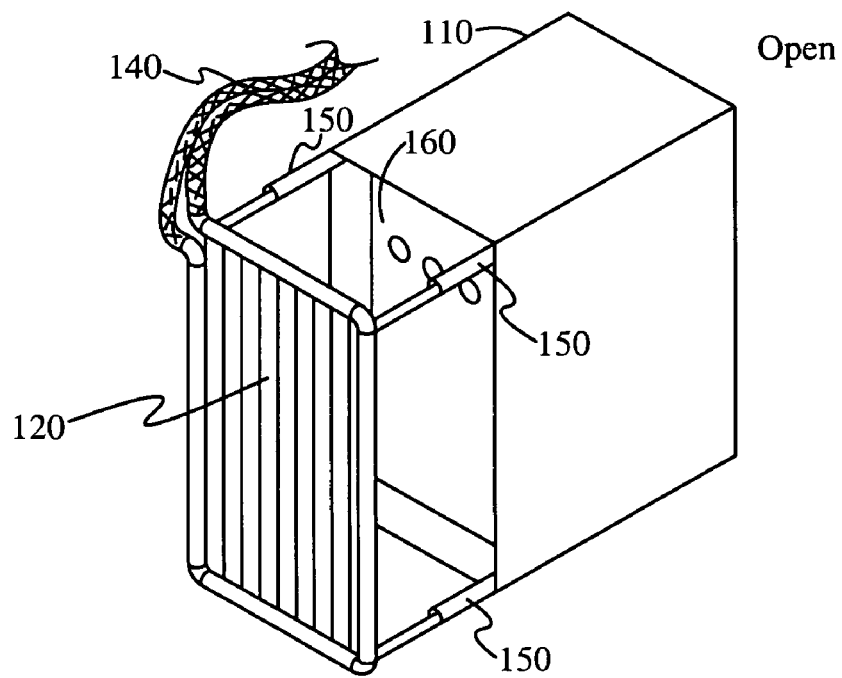
FIG. 5A illustrates an isometric view of the electronics enclosure with the access mechanism in an open position.

FIG. 5A illustrates an isometric view of the electronics enclosure 110 with the access mechanism in an open position. Slide rails 150 are coupled to the rear panel 120 and to the rear end of the electronics enclosure 110. The slide rails 150 enable the rear panel 120 to slide back and forth relative to the electronics enclosure 110, similar to a drawer in a filing cabinet. As shown in FIG. 4, the rear panel 120 is slid into the closed position. As shown in FIG. 5A, the rear panel 120 is slid into the open position. The flexible fluid lines 140 enable movement of the rear panel 120 between the open and closed positions while maintaining a fluid connection with the rear panel 120. Sliding the rear panel 120 back and forth does not provide a torsional flex on the fluid lines, simply a bending motion. While in the open position, duct work (not shown) included at the back of the electronic servers 160 can be removed if present, and access to the back of the electronics enclosure 110 including access to the electronics servers 160, or other components included within the electronics enclosure 110, is provided.

FIGS. 4 and 5A show the entire rear panel sliding back and forth. Alternatively, the rear panel and heat exchangers can be configured as separate pieces and each piece is configured with slide rails, as in individual drawers in the filing cabinet. In this configuration, each rear panel piece is fitted with flexible fluid lines. In some embodiments, the rear panel pieces are fluidically coupled in series, so that a flexible fluid line couples one rear panel piece to the next rear panel piece and so on, with the top-most and bottom-most rear panel pieces coupled to input and output flexible fluid lines, as in the flexible fluid lines 140 of FIGS. 4 and 5A. In other embodiments, each of the rear panel pieces is fitted with their own set of input and output flexible fluid lines. An advantage of segmenting the rear panel is to only disrupt cooling of a portion of the electronics servers, as opposed to opening the entire rear panel and disrupting cooling for all of the electronics servers. Additionally, there is no need for swivel joints that provide fluid connection between the heat exchangers and external fluid lines, as in a rear door cooling door assembly.

Although the electronics enclosure and sliding drawer(s) with heat exchanger(s) is described in relation to a rear panel of the electronics enclosure, the sliding drawer concept can be applied to a front panel of the electronics enclosure.

Figure 5B:
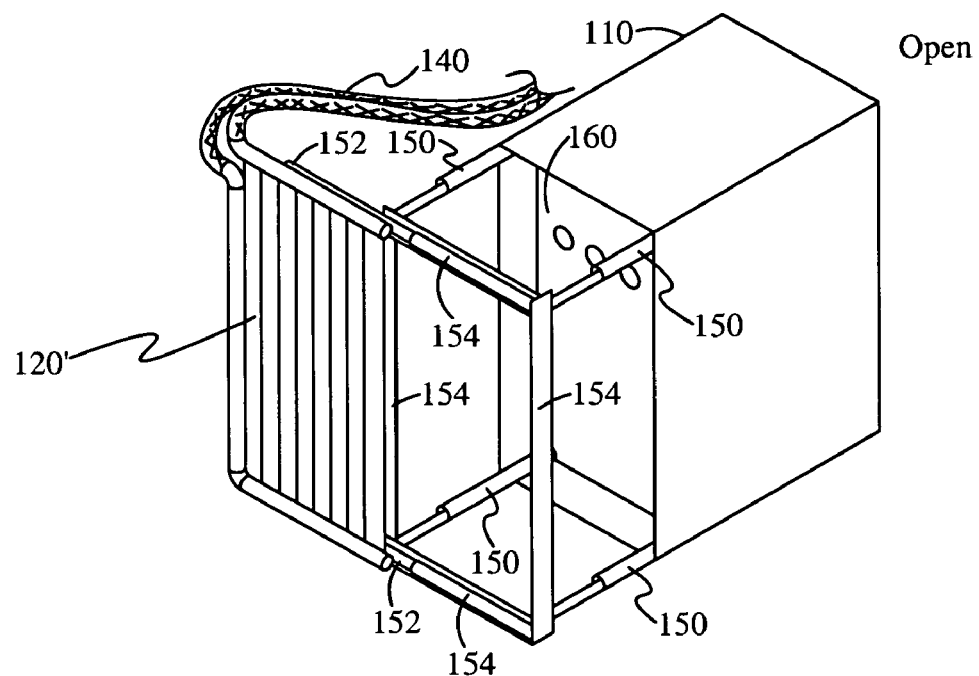
FIG. 5B illustrates an isometric view of the electronics enclosure with the sliding access mechanism according to another embodiment.

The sliding access mechanism of FIGS. 4 and 5A can be further adapted such that the rear panel slides from side to side to once in an open position, thereby providing additional ease with which to access the interior of the electronics enclosure. FIG. 5B illustrates an isometric view of the electronics enclosure 110 with an adapted version of the sliding access mechanism of FIG. 5B. The sliding access mechanism of FIG. 5B works the same as the sliding access mechanism of FIG. 5A with the addition of a second sliding assembly 152 configured to enable the rear panel to slide side to side. Specifically, the rear panel 120 of FIG. 5A is replaced with a frame 154 and a rear panel 120'. The frame 154 is coupled to each of the sliding assemblies 152. A top and a bottom sliding assembly 152 is coupled to the frame 154 and the rear panel 120'. The sliding assemblies 152 enable the rear panel 120' to move substantially orthogonally relative to the motion of the sliding assemblies 150. The sliding assemblies 152 are configured to move independently of the sliding assemblies 150. As such, the rear panel 120' can be moved while the sliding assemblies 150 are in the closed position or any degree of the open position, that is from a slightly open position to a maximum open position. FIG. 5B shows the rear panel 120' sliding to the left. Alternatively, the rear panel 120' and the sliding assemblies 152 can be configured to slide the rear panel 120' to the right, or can be enabled so that the rear panel 120' can slide to both the left and the right.

Figure 6:
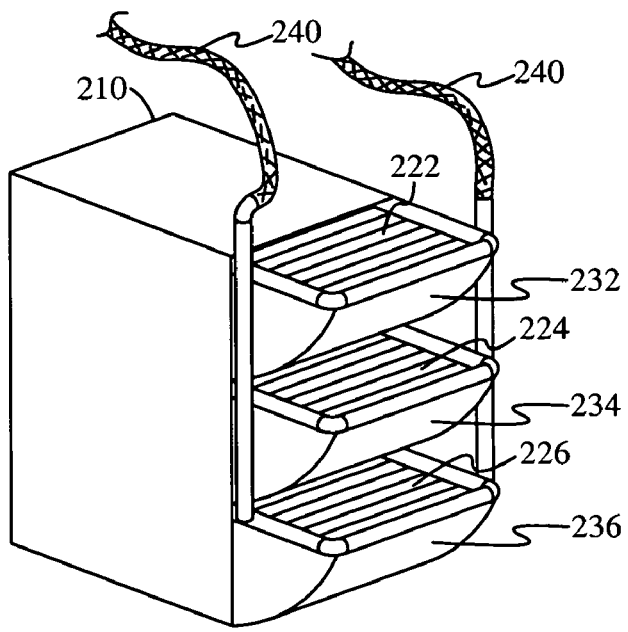
FIG. 6 illustrates an isometric view of an electronics enclosure with a second embodiment of an access mechanism.

FIG. 6 illustrates an isometric view of an electronics enclosure with a second embodiment of an access mechanism. The rear panel of an electronics enclosure 210 is replaced with a plurality of heat exchangers 222, 224, 226 and duct work 232, 234, 236. The inclusion of three sets of heat exchangers and duct works is for exemplary purposes only, more or less than three sets of heat exchangers and duct works can be used. Each of the heat exchangers 222, 224, 226 is coupled to fluid lines 240 for input and output of cooling fluid. The fluid lines can be flexible or hard-plumbed. Air output from the back of the electronics enclosure 210 is directed to each of the heat exchangers 222, 224, 226 via the duct work 232, 234, 236, respectively. The heat exchangers 222, 224, 226 are each positioned substantially horizontally, and the duct work 232, 234, 236 redirects the substantially horizontal air flow out the back of the electronic enclosure 210 to a substantially upward vertical air flow directed to the heat exchangers 222, 224, 226. As shown in FIG. 6, the duct work 232, 234, 236 has a curved surface and two sides to transition the horizontal air flow to the upward vertical air flow. Alternative duct work configuration can also be used to accomplish this change of air flow direction.

Each of the duct works 232, 234, 236 is detachably coupled to the electronics enclosure 210 and the corresponding heat exchanger 222, 224, 226. As such, each of the duct works 232, 234, 236 can be independently removed to provide access to the interior of the electronics enclosure 210. An advantage of this configuration is that the heat exchangers are not moved to provide interior access to the electronics enclosure. As a result, fluid pathways can be hard-plumbed. Additionally, there is no need for swivel joints that provide fluid connection between the heat exchangers and external fluid lines, as in a rear door cooling door assembly.

In some embodiments, the electronics enclosure 210 also includes a plenum and additional duct work of the type described above in relation to FIGS. 1-3. Although the heat exchangers 222, 224, 226 and duct work 232, 234, 236 are described in relation to replacing a rear panel of the electronics enclosure 210, similar heat exchangers and duct work can be used to replace a front panel of the electronics enclosure.

Figure 7:
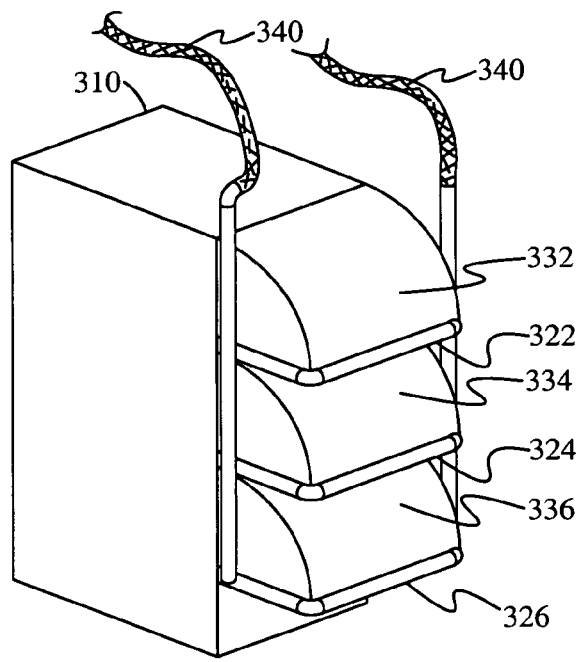
FIG. 7 illustrates an isometric view of an electronics enclosure with a third embodiment of an access mechanism.

In FIG. 6, the heat exchangers and duct work are configured to direct air upward. In an alternative configuration, the heat exchangers and duct work are configured to direct air downward. FIG. 7 illustrates an isometric view of an electronics enclosure with a third embodiment of an access mechanism. The access mechanism of FIG. 7 is configured similarly as the access mechanism of FIG. 6 except that the heat exchanges and duct work are configured to direct air downward. Specifically, the heat exchangers 322, 324, 326 replace the heat exchangers 222, 224, 226 of FIG. 6, and duct work 332, 334, 336 replaces duct works 232, 234, 236 of FIG. 6. Each of the heat exchangers 322, 324, 326 is coupled to fluid lines 340 for input and output of cooling fluid. The fluid lines 340 can be flexible or hard-plumbed. Air output from the back of the electronics enclosure 310 is directed to each of the heat exchangers 322, 324, 326 via the duct works 332, 334, 336, respectively. The heat exchangers 322, 324, 326 are each positioned substantially horizontally, and the duct works 332, 334, 336 redirects the substantially horizontal air flow out the back of the electronic enclosure 210 to a substantially downward vertical air flow directed to the heat exchangers 322, 324, 326. As shown in FIG. 7, each of the duct works 332, 334, 336 has a curved surface and two sides to transition the horizontal air flow to the downward vertical air flow. Alternative duct work configuration can also be used to accomplish this change of air flow direction.

Each of the duct works 332, 334, 336 is detachably coupled to the electronics enclosure 310 and the corresponding heat exchanger 322, 324, 326. As such, each of the duct works 332, 334, 336 can be independently removed to provide access to the interior of the electronics enclosure 310. To protect the heat exchangers 322, 324, 326 while the duct works 332, 334, 336 are removed, a protective cover having a perforated pattern is used. The perforated pattern enables air flow through the cover, but provides protection against physical contact with the heat exchanger surface. Examples of a perforated protective cover include, but are not limited to, a wire mesh, a metal sheet with perforations, a parallel pattern of metal rods, and a cross-hatched pattern of metal rods.

Figure 9:
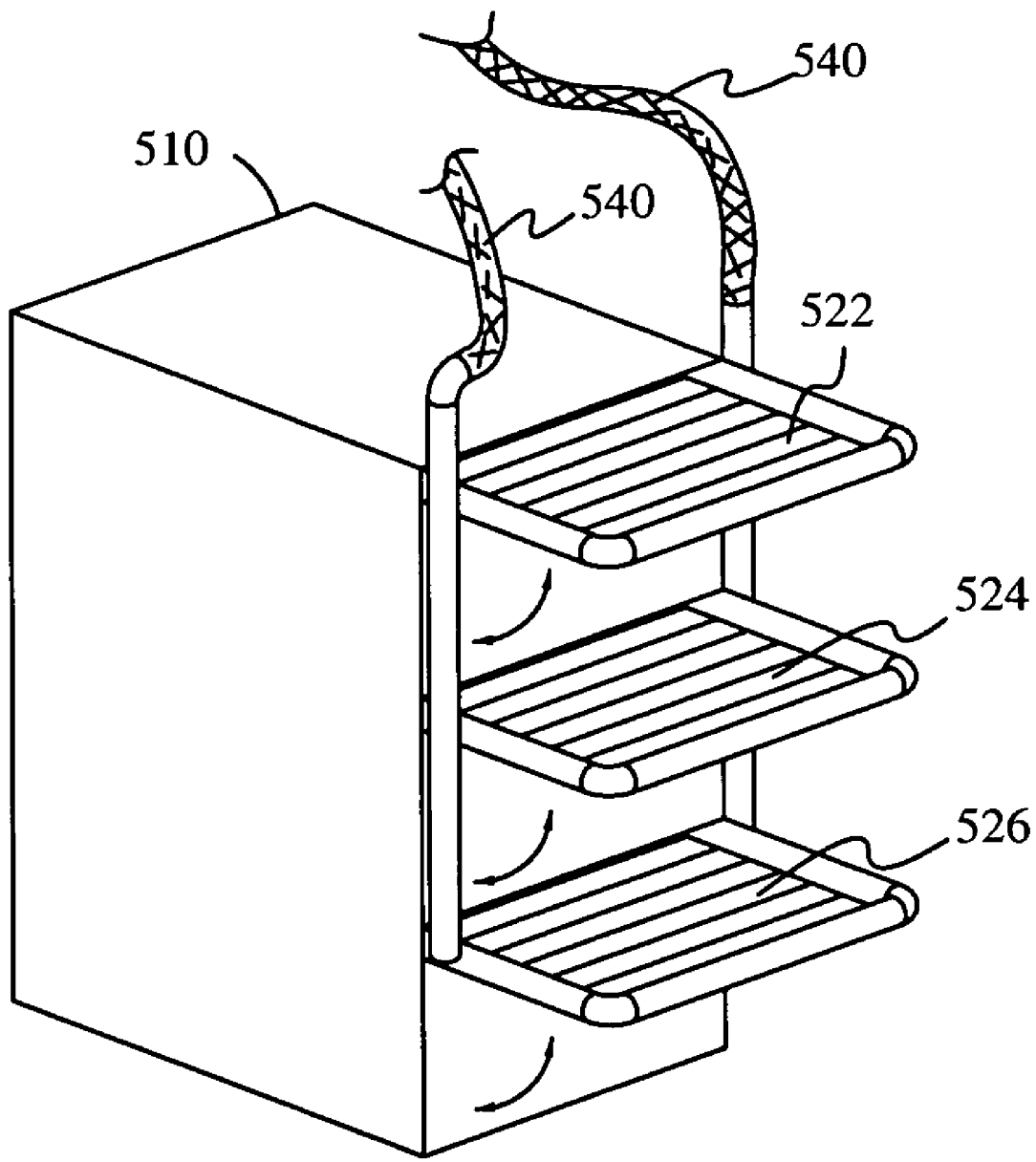
FIG. 9 illustrates an isometric view of an electronics enclosure with a fourth embodiment of an access mechanism.

FIG. 9 illustrates an isometric view of an electronics enclosure with a fourth embodiment of an access mechanism. The rear panel of an electronics enclosure 510 is replaced with a plurality of heat exchangers 522, 524, 526, each of which is pivotally coupled to the back end of the electronics enclosure 510. The inclusion of three heat exchangers is for exemplary purposes only, more or less than three heat exchangers can be used. Each of the heat exchangers 522, 524, 526 is coupled to fluid lines 540 for input and output of cooling fluid. The fluid lines can be flexible or hard-plumbed. Air output from the back of the electronics enclosure 510 is directed to each of the heat exchangers 522, 524, 526. The heat exchangers 522, 524, 526 are each configured to swivel upward. In other words, a top end of each heat exchangers 522, 524, 526 is coupled to the electronics enclosure 510 such that a bottom end of each heat exchangers 522, 524, 526 can swing up to open and down to close. Each of the heat exchangers 522, 524, 526 is coupled to the electronics enclosure 510 using one or more swivel joints that maintain a fluid connection between the heat exchangers 522, 524, 526 and the fluid lines 540 while the heat exchangers 522, 524, 526 are in either the up or down position. As shown in FIG. 9, each of the heat exchangers is in the up position. Although all three heat exchanges 522, 524, 526 are shown in the up position, it is understood that each of the heat exchangers 522, 524, 526 can be opened and closed independently. While in the up position, access is provided to the interior of the electronics enclosure 510. The heat exchangers 522, 524, 526 are configured to rotate from 0 to 90 degrees, and in some cases greater than 90 degrees. Rotating to less than 90 degrees provides internal access to the interior of the electronics enclosure, but does not enable the installation and/or removal of an electronics server. Rotating to 90 degrees or greater does enable the installation and/or removal of an electronics server.

In some embodiments, the electronics enclosure 510 also includes a plenum and additional duct work of the type described above in relation to FIGS. 1-3. Although the heat exchangers 522, 524, 526 are described in relation to replacing a rear panel of the electronics enclosure 510, similar heat exchangers can be used to replace a front panel of the electronics enclosure.

In FIG. 9, the heat exchangers are configured for a bottom end to swivel up and down. In an alternative configuration, the heat exchangers are configured to swivel downward. In other words, a bottom end of each heat exchangers is coupled to the electronics enclosure such that a top end of each heat exchangers can swing down to open and up to close. A protective cover can be added to each of the heat exchangers.

Supplemental cooling can be added to the electronics enclosure without adapting the rear or front access panels, thereby maintaining conventional access to the interior of the electronics enclosure. In this case, a supplemental cooling assembly is added to the top of the electronics enclosure, and air output from the rear of each electronics server is directed to the supplemental cooling assembly before being output from the electronics enclosure.

Figure 8:
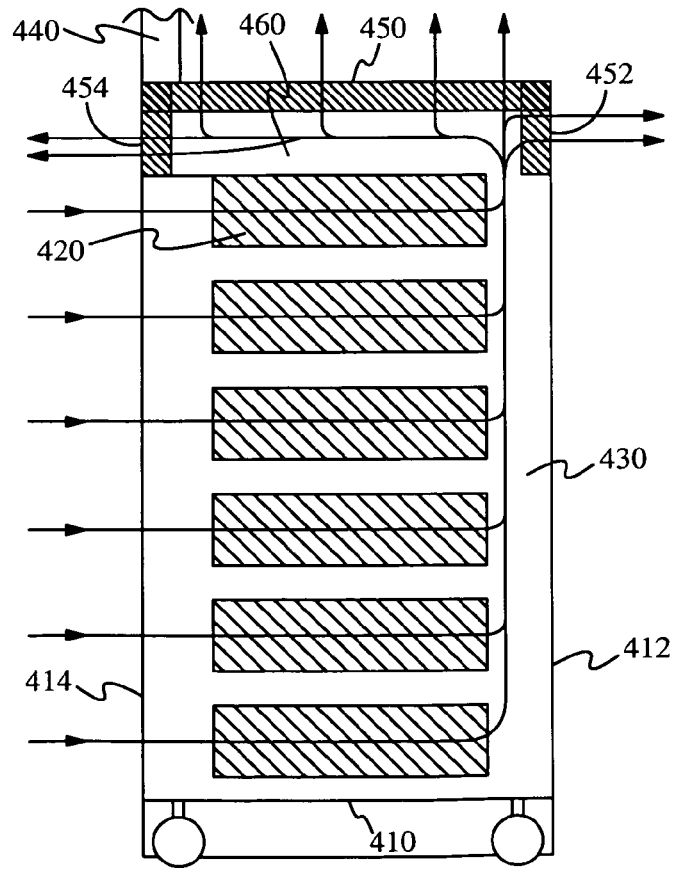
FIG. 8 illustrates a cut out side view of a supplemental cooling assembly coupled to an electronics enclosure.

FIG. 8 illustrates a cut out side view of a supplemental cooling assembly coupled to an electronics enclosure. A plurality of heat generating devices, such as electronics servers 420, are stored within the electronics enclosure 410. The electronics enclosure 410 is configured to enable airflow from a first side 414 toward a second side 412. The first side 414 is configured with air vents to enable airflow into the electronics enclosure 410. The second side 412 is configured as a solid panel to block air flow. In some embodiments, the second side 412 is a solid door. Air flow through the electronics enclosure 410 is generated by one or more internal air moving system (not shown) positioned within the electronics enclosure 410, for example one or more internal fans included as part of each electronics server 420.

Between the rear end of each electronics server 420 and the second side 412 is a back plenum 430. The back plenum 430 is formed from either a back portion of the electronics enclosure 410, or the back plenum 430 and the second side 412 are added as an extension to an existing electronics enclosure. Heated air flows out the rear of each electronic server 420 and into the back plenum 430. The second side 412 prevents the heated air from exiting the electronics enclosure 410, and as a result, the heated air rises to a top plenum 460. In some embodiments, a top portion of an existing electronics enclosure is adapted to include the top plenum. In other embodiments, the top plenum is coupled to a top vented surface of the electronics enclosure. The top plenum 460 is formed by a top panel and four side panels. At least one of the panels is vented. One or more heat exchangers are coupled to each vented panel. As shown in FIG. 8, the top panel is vented and includes at least one heat exchanger 450, a front panel is vented and includes at least one heat exchanger 454, and a back panel is vented and includes at least one heat exchanger 452. The heat exchangers 450, 452, 454 are coupled to inlet and outlet fluid lines 440. Heated air entering the top plenum 460 flows through the heat exchangers 450, 452, 454, and cooled air is output from the heat exchangers 450, 452, 454. In some embodiments, one or more fans can be positioned in the top plenum 460, or a supplemental fan tray can be added on the exterior side of the heat exchanger 450, and/or the heat exchangers 452, 454 to enhance air flow.

An advantage of the supplemental cooling assembly is that the heat exchangers do not inhibit access to the interior of the electronics enclosure. As shown and described in relation to FIG. 8, a top portion of an existing electronics enclosure is adapted to include a top plenum. One or more of the panels that make up the top plenum are vented, and one or more heat exchangers are coupled to each vented panel. In other embodiments, the top plenum is added as an extension to an existing electronics enclosure. To accommodate this top plenum space within an existing electronics enclosure, one or more electronics servers may need to be removed from the top portion of the electronics enclosure.

The cooling system is described above for use with an electronics enclosure, such as a server rack. In alternative applications, the cooling system is used with other cooling devices that have fans moving air through heat exchangers, such as overhead cooling units used in data centers. In general, the power efficiency of such cooling devices can be improved through the use of the cooling system of the present invention.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A cooling assembly comprising:
 a. an electronics enclosure including a first side and an exposed second side, wherein the electronics enclosure includes one or more heat generating devices, each heat generating device having one or more electrical connection lines extending from a rear side, further wherein the one or more heat generating devices are aligned such the rear side of each heat generating device is facing the second side of the electronics enclosure; and b. a plurality of duct guides, each duct guide includes a deformable first end configured to locally deform about electrical connection lines coincident with the first end.

2. The cooling assembly of claim 1 wherein at least one of the plurality of duct guides comprises foam.

3. The cooling assembly of claim 1 wherein at least one of the plurality of duct guides includes a plurality of slits, each slit extends through an entire thickness of the duct guide and extends a partial length into the duct guide starting from the first end, wherein each slit is configured to accommodate one or more electrical connection lines.

4. The cooling assembly of claim 3 wherein the at least one of the plurality of duct guides further includes a plurality of holes, each hole extends through an entire thickness of the duct guide, and one hole is positioned at an end of each slit.

5. The cooling assembly of claim 1 wherein at least one of the plurality of duct guides includes a plurality of holes, each hole extends through an entire thickness of the duct guide, wherein each hole is configured to accommodate one or more electrical connection lines.

6. The cooling assembly of claim 1 wherein at least one of the plurality of duct guides comprises bristles.

7. The cooling assembly of claim 1 wherein at least one or the plurality of duct guides comprises a second end comprising a rigid structure.

8. The cooling assembly of claim 1 further comprising a cooling panel including a plurality of heat exchangers, wherein the plurality of duct guides are coupled between the cooling panel and the second side of the electronics enclosure.

9. The cooling assembly of claim 1 wherein at least one of the plurality of duct guides is compressible.

10. The cooling assembly of claim 9 wherein the duct guide in an uncompressed state is wider than the electronics enclosure such that when the duct guide is in a compressed state and positioned within the electronics enclosure, an outward decompression force is exerted on the electronics enclosure thereby holding the compressed duct guide in place.

11. The cooling assembly of claim 1 wherein the deformable first end of one or more duct guides is positioned proximate to the rear side of the one or more heat generating devices.

12. The cooling assembly of claim 1 wherein the deformable first end of one or more duct guides is positioned distal from the rear side of the one or more heat generating devices.

* * * * *

UNITED STATES PATENT AND TRADEMARK OFFICE
CERTIFICATE OF CORRECTION

PATENT NO. : 7,660,117 B2  Page 1 of 1
APPLICATION NO. : 12/221945
DATED : February 9, 2010
INVENTOR(S) : Werner et al.

It is certified that error appears in the above-identified patent and that said Letters Patent is hereby corrected as shown below:

IN THE CLAIMS

In the Claims, in Claim 1, limitation "a.", at column 14, line 65, please insert the word -- that -- between the words "such" and "the" so that the limitation correctly reads:

-- a. an electronics enclosure including a first side and an exposed second side, wherein the electronics enclosure includes one or more heat generating devices, each heat generating device having one or more electrical connection lines extending from a rear side, further wherein the one or more heat generating devices are aligned such that the rear side of each heat generating device is facing the second side of the electronics enclosure; and --

Signed and Sealed this

Twenty-third Day of March, 2010

David J. Kappos
*Director of the United States Patent and Trademark Office*